(12) United States Patent
Liskow

(10) Patent No.: US 10,524,391 B2
(45) Date of Patent: Dec. 31, 2019

(54) ELECTRONIC ASSEMBLY, IN PARTICULAR FOR A TRANSMISSION CONTROL MODULE, WITH ATTACHED COOLING BODY

(71) Applicant: Robert Bosch GmbH, Stuttgart (DE)

(72) Inventor: Uwe Liskow, Asperg (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/569,253

(22) PCT Filed: Mar. 2, 2016

(86) PCT No.: PCT/EP2016/054384
§ 371 (c)(1),
(2) Date: Oct. 25, 2017

(87) PCT Pub. No.: WO2016/173747
PCT Pub. Date: Nov. 3, 2016

(65) Prior Publication Data
US 2018/0124956 A1    May 3, 2018

(30) Foreign Application Priority Data
Apr. 29, 2015 (DE) .................. 10 2015 207 867

(51) Int. Cl.
*H05K 7/20* (2006.01)
*H01L 23/31* (2006.01)
(Continued)

(52) U.S. Cl.
CPC ..... *H05K 7/20463* (2013.01); *H05K 7/20854* (2013.01); *H01L 23/3121* (2013.01); *H01L 23/42* (2013.01); *H05K 1/0203* (2013.01)

(58) Field of Classification Search
CPC .......... H05K 7/20463; H05K 7/20854; H05K 5/0082; H05K 1/0203; H01L 23/42; H01L 23/3121
(Continued)

(56) References Cited

U.S. PATENT DOCUMENTS 6,285,551 B1 * 9/2001 Brandenburg ....... H05K 3/0061
165/185
7,134,194 B2 * 11/2006 Brandenburg ......... H05K 1/147
29/832
(Continued)

FOREIGN PATENT DOCUMENTS

CN         1722431 A    1/2006
CN       103857252 A    6/2014
(Continued)

OTHER PUBLICATIONS

International Search Report corresponding to PCT Application No. PCT/EP2016/054384, dated May 30, 2016 (German and English language document) (5 pages).

*Primary Examiner* — Zachary Pape
(74) *Attorney, Agent, or Firm* — Magnot, Moore & Beck LLP

(57) ABSTRACT

An electronic assembly for a transmission control module includes a printed circuit board and a heat sink. The circuit board includes a first side, a second side averted from the first side, and at least one heat-generating component arranged on the first side and covered with at least one flowable and curable protective compound. The heat sink has an inner face facing the second side and is, at least in sections, spaced apart from the circuit board by at least one gap. The gap is at least partially filled with the at least one flowable and curable protective compound such that the flowable and curable protective compound is in direct contact with the circuit board and the heat sink. The heat sink adheres to the protective compound in a cohesive manner when the flowable and curable protective compound is in the cured state.

10 Claims, 2 Drawing Sheets

(51) Int. Cl.
*H05K 1/02* (2006.01)
*H05K 5/00* (2006.01)
*H01L 23/42* (2006.01)

(58) Field of Classification Search
USPC .............. 361/705, 706, 715, 719; 165/80.2; 174/526
See application file for complete search history.

(56) References Cited

U.S. PATENT DOCUMENTS

| | | | |
|---|---|---|---|
| 7,473,585 B2* | 1/2009 | Brandenburg | H01L 23/3121 438/124 |
| 9,408,291 B2* | 8/2016 | Ott | H05K 1/0203 |
| 2006/0281230 A1 | 12/2006 | Brandenburg et al. | |
| 2009/0059498 A1* | 3/2009 | Jeong | G06F 1/1613 361/748 |
| 2017/0215271 A1* | 7/2017 | Ito | B60R 16/02 |
| 2017/0294776 A1* | 10/2017 | Maier | H02H 9/045 |

FOREIGN PATENT DOCUMENTS

| | | |
|---|---|---|
| DE | 197 01 731 A1 | 7/1998 |
| DE | 10 2012 209 034 A1 | 12/2013 |
| DE | 10 2012 222 180 A1 | 6/2014 |
| EP | 0 902 611 A2 | 3/1999 |
| JP | 2000-151083 A | 5/2000 |
| JP | 2001-257306 A | 9/2001 |
| JP | 2002-261198 A | 9/2002 |
| JP | 2006-32490 A | 2/2006 |
| JP | 2006-147658 A | 6/2006 |

* cited by examiner

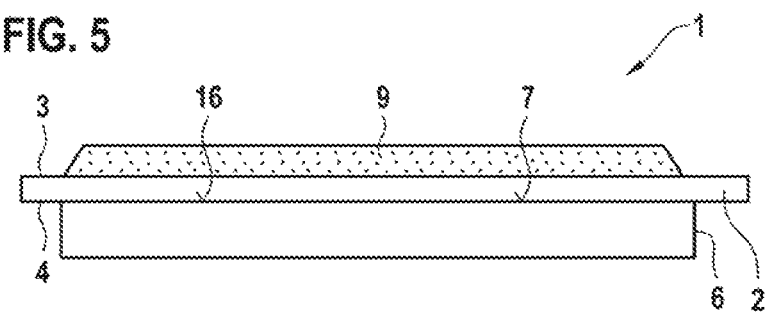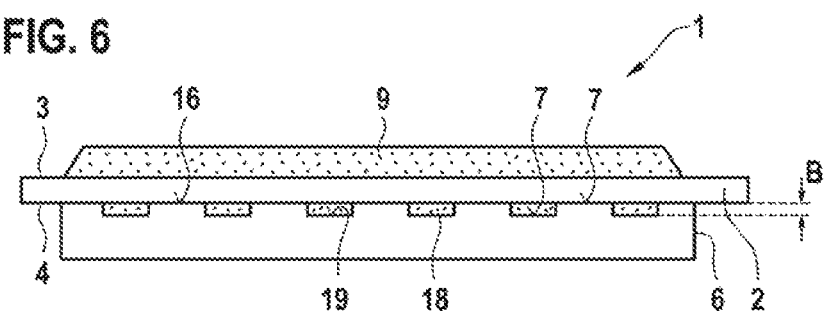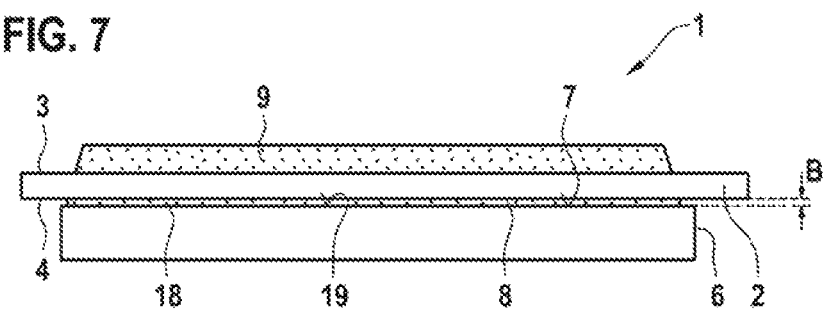

ELECTRONIC ASSEMBLY, IN PARTICULAR FOR A TRANSMISSION CONTROL MODULE, WITH ATTACHED COOLING BODY

This application is a 35 U.S.C. § 371 National Stage Application of PCT/EP2016/054384, filed on Mar. 2, 2016, which claims the benefit of priority to Serial No. DE 10 2015 207 867.1, filed on Apr. 29, 2015 in Germany, the disclosures of which are incorporated herein by reference in their entirety.

BACKGROUND

The disclosure relates to an electronic assembly, in particular for a transmission control module.

In automotive engineering, for transmission actuation purposes, use is made of electronic control modules installed on the transmission. The control modules may have actuators, sensors, plug connectors, at least one encapsulated control unit (TCU, Transmission Control Unit) and further components. The encapsulated control unit forms an electronic assembly. For the best possible dissipation of the heat released by electrical or electronic components of the electronic assembly, it is known for the electronic assemblies to be equipped with a cooling body.

Electrical or electronic components may be highly sensitive to loads such as attack by fluids, such as for example transmission oils. To protect electrical or electronic components against such loads, it is known for a protective covering to be applied over the components on the circuit board, which protective covering sealingly covers the components to the outside and thus protects said components from the loads. The protective covering may for example comprise a housing cover, an encapsulation, a lacquer or a molded compound. For example, the generic DE 197 01 731 A1 presents a housing for an electronic assembly formed as a control module, wherein a circuit board which is populated with components on both sides is supported, at locations at which it is populated with heat-generating components, on a housing part which is composed of heat-conducting material and which serves as a cooling body. The electrical and electronic components are covered by a mechanically fastened housing cover.

DE 10 2012 209 034 A1 presents for example an electronic assembly with a protective cover which is composed of a molded compound and in which a cooling body is also arranged.

SUMMARY

According to the disclosure, an electronic assembly, in particular for a transmission control module, is proposed. Said electronic assembly comprises a circuit board with a first side and with a second side averted from the first side and with at least one heat-generating component arranged on the first side of the circuit board, wherein the electronic assembly furthermore comprises a cooling body which has an inner surface facing toward the second side of the circuit board, wherein the inner surface of the cooling body is, at least in sections, spaced apart from the circuit board by at least one gap. According to the disclosure, the at least one heat-generating component is covered with a flowable and curable protective compound and the at least one gap is at least partially filled with the at least one flowable and curable protective compound such that the flowable and curable protective compound is in direct contact with the circuit board and with the cooling body, and in the cured state of the flowable and curable protective compound, the cooling body cohesively adheres to the protective compound.

In relation to the prior art, the electronic assembly having the features disclosed herein has the advantage that the flowable and curable protective compound firstly advantageously sealingly covers the electrical and/or electronic components on the circuit board and can thereby protect these against loads, for example mechanical loads, or, in a usage situation in the transmission oil, against attack of the surrounding medium, and said protective compound simultaneously serves for fastening the circuit board to the cooling body, wherein a gap between the cooling body and the circuit board is filled, by injection molding or casting, for example with an epoxy resin compound which adheres both to the cooling body and to the circuit board, and the circuit board is thus connected to the cooling body in a simple and inexpensive manner. The gap may advantageously be utilized for the arrangement of components on the second side, facing toward the cooling body, of the circuit board. Furthermore, the protective compound may make a supporting contribution to the dissipation of the heat generated by the components, for example by means of vias through the circuit board and in the direction of the cooling body and, on the first side of the circuit board, in the direction of the exterior region of the electronic assembly, for example in the direction of a surrounding transmission oil. Furthermore, the circuit board can be populated in a particularly advantageous and inexpensive manner in standard processes, without special components for, for example, slug-up heat dissipation, in the case of which the heat is dissipated via spacer plates and heat dissipation plates to a cooling body arranged above the circuit board.

Further advantageous embodiments and refinements of the disclosure are made possible by means of the features further disclosed herein.

It is advantageously possible for the inner surface of the cooling body to have at least one recess which is surrounded in encircling fashion by at least one wall. The circuit board can thus be supported directly on the wall of the cooling body and, at the same time, the flowable and curable compound can be introduced into the recess such that it cohesively adheres to the circuit board and to the cooling body and connects these to one another in an advantageous manner.

Owing to the recess formed on the inner surface of the cooling body, it is advantageously possible for further electrical or electronic components to be arranged not only on the first side of the circuit board but also on the second side of the circuit board, such that said further electrical and electronic components are arranged within the recess. As a result of the attachment of electrical and electronic components to the second side of the circuit board, the number of components on the first side of the circuit board and thus the area of the circuit board can be reduced. The circuit board can thus be attached closer to the cooling body, and thus the overall height of the electronic assembly can be reduced.

The circuit board is particularly advantageously in direct contact with the cooling body by means of support surfaces of the wall, such that the heat generated on the circuit board by the heat-generating components can be dissipated to the cooling body in an effective manner. If the recess is formed so as to be surrounded in encircling fashion by a support surface, this has the advantage that the circuit board can be supported in a stable and secure manner on the cooling body.

The circuit board may also be spaced apart from the wall by a narrow intermediate space, for example with a spacing of 50 micrometers to one millimeter. Owing to the small intermediate space, the heat generated by the components arranged on the first side of the circuit board can advantageously be dissipated to the cooling body.

The intermediate space between the wall and the circuit board may for example advantageously be filled with the flowable and curable protective compound, such that the heat generated on the circuit board can be dissipated to the cooling body via a low thermal resistance of the protective compound. Furthermore, it is advantageously possible for further parts of the second side of the circuit board to be connected to further parts of the inner surface of the cooling body via the flowable and curable protective compound, which can ensure additional stability of the connection between the circuit board and the cooling body and additional protection of the components arranged on the circuit board.

The wall may particularly advantageously be arranged directly below the heat-generating components, such that the spacing between the heat-generating components and the cooling body is as small as possible, and thus the heat generated by the components on the circuit board can be dissipated in a particularly effective manner, for example by means of vias, to the cooling body. It may prove to be advantageous for thermally conductive heat-conducting layers to be arranged on the second side of the circuit board directly below the heat-generating components arranged on the first side of the circuit board. Via said heat-conducting layers, good thermal contact can be produced between the heat-generating components on the circuit board and the wall of the cooling body, which proves to be particularly advantageous if the wall of the cooling body is not arranged directly below, or is only partially arranged directly below, the heat-generating components.

If the circuit board is equipped with components only on the first side, it may prove to be advantageous if the entire inner surface of the cooling body is formed without a recess, that is to say for example so as to be planar, such that the entirety of the second side of the circuit board is spaced apart from the inner surface of the cooling body by a gap, where the gap has a width which amounts to for example between fifty millimeters and one millimeter over the entire gap. If the gap is particularly advantageously completely filled with the flowable and curable protective compound, it is ensured that the circuit board is fastened in a particularly secure manner to the cooling body and is supported on the latter in a particularly stable manner.

To additionally protect the assembly and increase the stability of the assembly, it is particularly advantageous if the protective compound which covers the heat-generating components is formed in one piece with the protective compound which connects the cooling body and the circuit board.

The protective compound which covers the heat-generating components may for example particularly advantageously and easily be connected through one or more apertures in the circuit board to the protective compound which connects the cooling body and the circuit board, and thus formed in one piece with the latter protective compound.

BRIEF DESCRIPTION OF THE DRAWINGS

Exemplary embodiments of the invention disclosure are illustrated in the drawing and will be discussed in more detail in the following description. In the drawing:

FIG. 5 shows a side view of the first exemplary embodiment;

FIG. 6 shows a side view of a second exemplary embodiment; and

FIG. 7 shows a side view of a third exemplary embodiment.

DETAILED DESCRIPTION

Figure 1:
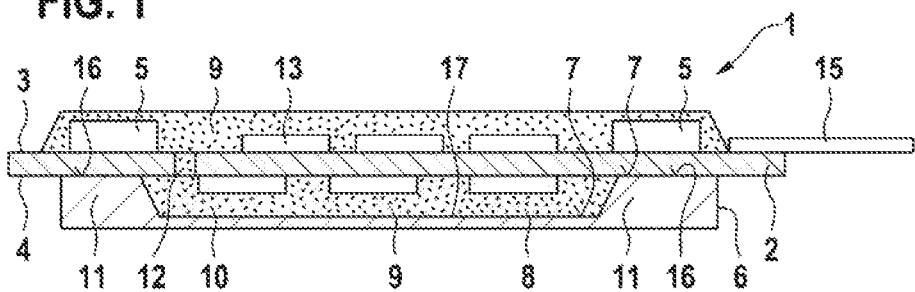
FIG. 1 shows a schematic cross section through a first exemplary embodiment of the electronic assembly according to the disclosure.

FIG. 1 shows a schematic cross section through a first exemplary embodiment of the electronic assembly 1, which may be part of a transmission control module which may be installed for example on or in a motor vehicle transmission. The electronic assembly 1 comprises a circuit board 2, which on the first side 3 is equipped with at least one heat-generating component 5, and a cooling body 6. An inner surface 7 of the cooling body 6 faces toward a second side 4 of the circuit board 2, which is averted from the first side 3 of the circuit board 2, and said inner surface is spaced apart from said second side at least in sections by a gap 8.

In this example, the circuit board 2 is for example a circuit board of FR4 design or of a higher value, that is to say for example a circuit board composed of glass-fiber-reinforced epoxy resin. The circuit board 2 may however also be an HDI circuit board (High Density Interconnect circuit board), an LTCC (Low Temperature Cofired Ceramics) circuit board or some other suitable circuit board. One or more heat-generating components 5 are arranged on the first side 3 of the circuit board 2, which components are connected to one another by conductor tracks. This may involve a single heat-generating component 5 or multiple electrical and/or electronic components, in particular active components such as for example IC chips, transistors or ASICs, which are electrically connected by means of conductor tracks of the circuit board 2 and which form a control circuit. The circuit board 2 may be electrically contacted by means of one or more electrical connection elements 15, for example flexible electrical circuit boards (FPC=Flexible Printed Circuit Board), cables or leadframes, with other electrical or electronic components, for example sensors, actuators and plug connector parts, which are provided outside the electronic assembly 1 and which are not shown in FIG. 1. In addition to the at least one heat-generating component 5, it is also possible for one or more further electrical and/or electronic, non-heat-generating components 13 to be arranged on the first side 3 and/or on the second side 4 of the circuit board 2, which components are electrically connected to one another and/or to one or more heat-generating components 5 by means of conductor tracks of the circuit board 2 and form a control circuit. The components 13 may for example be passive components.

In this exemplary embodiment, the heat-generating and non-heat-generating components 5, 13 arranged on the first side 3 of the circuit board 2 are covered, and thus protected for example against mechanical loads or against attack of fluid media such as for example transmission oil, by a flowable and curable protective compound 9. The flowable and curable protective compound 9 may, as illustrated in FIG. 1, be formed in one piece and sealingly cover all of the components 5, 13 arranged on the first side 3 of the circuit board 2 under one common protective covering. Said flowable and curable protective compound may however also be formed in multiple parts and sealingly cover individual components 5, 13 or groups of components 5, 13 arranged on the first side 3 of the circuit board 2. In this exemplary embodiment, the flowable and curable protective compound 9, which also sealingly covers the components 5, 13 on the first side 3 of the circuit board 2, is introduced into a gap 8 between the second side 4 of the circuit board 2 and the inner surface 7 of the cooling body 6 in order to cover the further electrical and/or electronic components 13 arranged on the second side 4 of the circuit board 2 and simultaneously connect the cooling body 6 to the circuit board 2. In this exemplary embodiment, the inner surface 7 has a recess 10 which is formed so as to have a base surrounded by a wall 11, wherein the gap 8 is formed by the spacing between the base 17 of the recess 10 and the second side 4 of the circuit board 2. The recess 10 may, as illustrated in FIG. 1, be completely filled with the flowable and curable protective compound 9. The recess 10 may however also be only partially filled with the flowable and curable protective compound 9.

In the context of the present application, a flowable and curable protective compound 9 is to be understood to mean a flowable and liquid substance which solidifies as a result of a curing process, wherein, in the cured state, the substance cohesively adheres to the material of the circuit board 2 and to the material of the cooling body 6. Here, the flowable and curable protective compound 9 adheres for example to the second side 4 of the circuit board 2 and to the inner surface 7 of the cooling body 6. The flowable and curable protective compound 9 may for example be a polymer protective system and may be applied for example by encapsulation by injection molding or by casting. In particular, said protective compound may involve a thermoset.

The cooling body 6 may for example be composed of a heat-conducting material such as aluminum or of heat-conducting plastic. In this exemplary embodiment, the cooling body 6 is formed so as to have, in a region directly below the at least one heat-generating component 5, a support surface 16 on the wall 11, at which support surface the circuit board 2 is in direct contact with the inner surface 7 of the cooling body 6, and thus the heat generated by the heat-generating components 5 can be dissipated by the circuit board 2, in particular by means of thermal vias in the circuit board 2, to the cooling body 6. Furthermore, in this exemplary embodiment, further components 13 are arranged, on the second side 4 of the circuit board 2, in the recess 10, such that the circuit board 2 can be placed onto the support surface 16 on the inner surface 7 of the cooling body 6. Here, the spacing between the base 17, which is surrounded in an encircling fashion by the wall 11, of the recess 10 and the second side 4 of the circuit board 2 forms the gap 8 which is at least partially filled with the at least one flowable and curable protective compound 9.

In the circuit board 2 there may be formed one or more apertures 12 through which the flowable and curable protective compound 9 which covers the heat-generating components 5 can be connected in one piece to the flowable and curable protective compound 9 situated in the gap 8. For example, during the manufacturing process, the protective compound 9 that has not yet cured can flow through the aperture 12 of the circuit board 2 into the gap 8. It is thus possible for the gap 8 to be filled with the flowable and curable protective compound 9, and at the same time for the heat-generating components 5 on the first side 3 of the circuit board 2 to be covered by the flowable and curable protective compound 9, in one working step.

Figure 2:
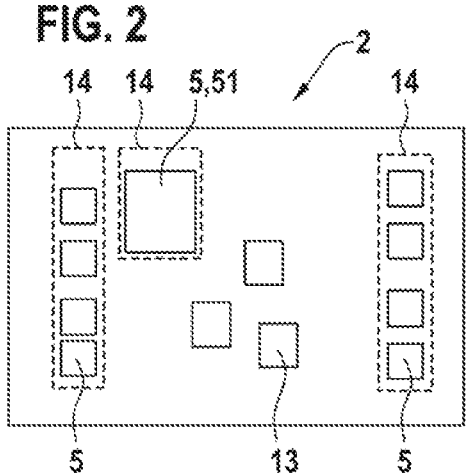
FIG. 2 shows a plan view of a circuit board illustrated by way of example.

FIG. 2 shows a plan view of a circuit board 2, illustrated by way of example, of the first exemplary embodiment. Said circuit board comprises heat-generating components 5, which are arranged for example on the first side 3 of the circuit board 2, and one or more further components 13, which are arranged on the first side 3 and/or on the second side 4 of the circuit board 2. Furthermore, heat-conducting layers 14, which may for example be formed as metallizations, are arranged on the second side 4 of the circuit board 2. These may involve a single, coherent heat-conducting layer 14, or several, non-coherent heat-conducting layers 14. The one or more heat-conducting layers 14 are arranged on the second side of the circuit board 2, at least partially directly below the heat-generating components 5 arranged on the first side 3 of the circuit board 2.

In the context of the present application, an object is a heat-generating component 5, a non-heat-generating component 13, a heat-conducting layer 14 or a wall 11. If a first object arranged on the second side 4 of the circuit board 2 is arranged partially directly below or above a second object arranged on the first side 3 of the circuit board 2, this is to be understood in the context of the present application to mean that the first object and the second object are arranged relative to one another on the circuit board such that a vertical projection of the first object onto a side 3, 4 of the circuit board 2 lies at least partially within a vertical projection of the second object onto the same side 3, 4 of the circuit board 2.

Figure 3:
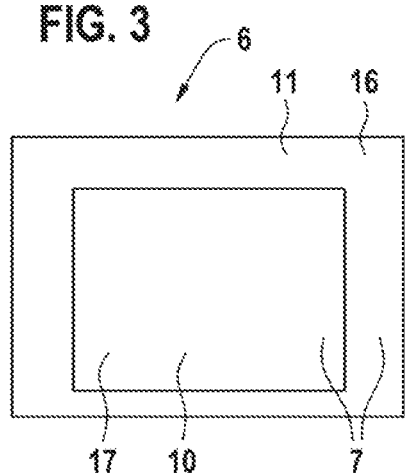
FIG. 3 shows a plan view of a cooling body illustrated by way of example.

FIG. 3 shows a plan view of the inner surface 7 of a cooling body 6 which is illustrated by way of example and which is adapted to the circuit board 2 illustrated by way of example in FIG. 2. On the cooling body 6 that is illustrated by way of example, there is formed a wall 11 with a support surface 16, onto which a circuit board 2 can be placed. Furthermore, in this exemplary embodiment, a recess 10 is formed in the inner surface 7 of the cooling body 6, the base 17 of which recess forms a planar surface and is surrounded in encircling fashion by the wall 11. It is however also possible for multiple recesses 10 to be formed on the inner surface 7 of the cooling body 6, which recesses are surrounded by one coherent wall 11 or by multiple walls 11, and in which recesses individual further components 13 or groups of further components 13 may be arranged.

Figure 4:
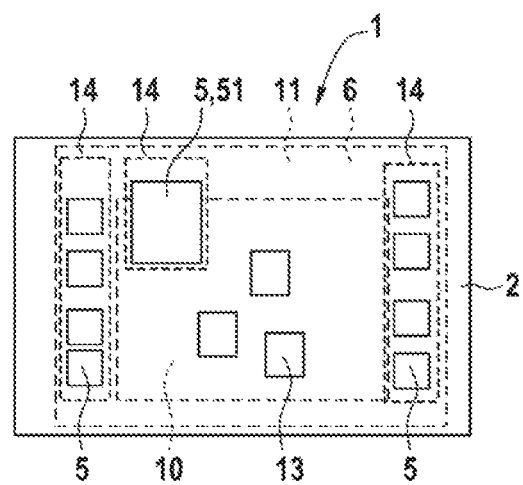
FIG. 4 shows a schematic superposition of FIG. 2 and FIG. 3.

FIG. 4 shows a schematic superposition of FIG. 2 and FIG. 3. The circuit board 2 illustrated by way of example lies with its second side 4 on the support surface 16 of the wall 11 on the inner surface 7 of the cooling body 6. In this usage example, the cooling body 6 is shaped such that, when the circuit board 2 is supported on the cooling body 6, the support surface 16 of the wall 11 is situated at least partially directly below the heat-generating components 5 arranged on the first side 3 of the circuit board 2 and thus good heat dissipation from the heat-generating components 5 via the circuit board 2 to the cooling body 6 is ensured. If, as shown by way of example in FIG. 4 in the case of a heat-generating component 51, the heat-generating component 51 is situated only partially directly above the support surface 16 of the wall 11 of the cooling body 6, it is for example possible, by means of a heat-conducting layer 14 arranged on the second side 4 of the circuit board 2, and for example by means of vias in the circuit board 2, for good thermal contact to be produced between the heat-generating component 5, the heat-conducting layer 14 and the support surface 16 of the wall 11 of the cooling body 6. If the wall 11 is for example situated not even partially directly below a heat-generating component 5, thermal contact can for example be produced between the heat-generating component 5 and the cooling body 6 by means of a heat-conducting layer 14. In the interior of the recess 10 arranged on the inner surface 7 of the cooling body 6, one or more further components 13 may for example also be arranged on the second side 4 of the circuit board 2, and the second side 4 of the circuit board 2 may simultaneously be in direct contact, via the support surface 16, with the inner surface 7 of the cooling body 6.

FIG. 5 shows a side view of the first exemplary embodiment. The electrical connection element 15 is not illustrated in FIG. 5. The flowable and curable protective compound 9 has been applied to the first side 3 of the circuit board 2, such that the heat-generating components 5 (not shown) arranged on the first side 3 of the circuit board 2 are sealingly covered to the outside. In this exemplary embodiment, the second side 4 of the circuit board 2 is supported on the support surface 16 of the wall 11 on the cooling body 6 and is thus in direct thermal contact with the support surface 16 of the cooling body 6. No flowable and curable protective compound 9 is situated between the support surface 16 of the cooling body 6 and the second side 4 of the circuit board 2. The flowable and curable protective compound 9 which connects the cooling body 6 and the circuit board 2 is arranged in the recess 10 (not illustrated in the side view), as can be seen in FIG. 1.

FIG. 6 shows a side view of a second exemplary embodiment of the electronic assembly 1, in which, by contrast to the first exemplary embodiment, the support surface 16 of the wall 11 is not formed in one piece and so as to fully encircle the recess 10, but rather is of multi-part form, wherein the wall 11 has not only the support surfaces 16 but also the spacing surfaces 19 which face toward the second side 4 of the circuit board 2 and at which the wall 11 is spaced apart from the second side 4 of the circuit board 2 by intermediate spaces 18 with a spacing dimension B. The intermediate spaces may for example be filled with a thin layer of the flowable and curable protective compound 9, and the wall 11 may be connected to the second side 4 of the circuit board 2 in this way. In this second exemplary embodiment, too, the flowable and curable protective compound 9 which connects the cooling body 6 and the circuit board 2 may additionally be arranged in a recess 10 (not illustrated in the side view), as discussed in FIG. 1 on the basis of the first exemplary embodiment.

FIG. 7 shows a third exemplary embodiment of the electronic assembly 1, in which the circuit board 2 is connected to the cooling body 6 by means of a layer of flowable and curable protective compound 9 of for example 50 micrometers to one millimeter. The layer of flowable and curable protective compound 9 is arranged in an intermediate space 18 which spaces the second side 4 of the circuit board 2 apart from the wall 11. In the third exemplary embodiment, too, the flowable and curable protective compound 9 which connects the cooling body 6 and the circuit board 2 may additionally be arranged in a recess 10 (not illustrated in the side view), as discussed in FIG. 1 on the basis of the first exemplary embodiment.

In a fourth exemplary embodiment, the entirety of the second side 4 of the circuit board 2 is spaced apart from the inner surface 7 of the cooling body 6 by a gap 8, wherein the gap 8 has a width which amounts for example to between fifty millimeters and one millimeter over the entire gap 8. In the fourth exemplary embodiment, the gap 8 is at least partially filled with the flowable and curable protective compound 9. In the fourth exemplary embodiment, by contrast to the preceding exemplary embodiments, no recess 10, no wall 11 and no support surface 16 is formed on the cooling body 6, and the one or more further components 13 are arranged only on the first side 3 of the circuit board 2.

Further exemplary embodiments and mixed forms of the illustrated exemplary embodiments are self-evidently also possible.

The invention claimed is:

1. An electronic assembly for a transmission control module, comprising:
    a circuit board including:
        a first side;
        a second side averted from the first side; and
        at least one heat-generating component arranged on the first side of the circuit board and covered with at least one flowable and curable protective compound; and
    a cooling body including an inner surface facing toward the second side of the circuit board, the inner surface, at least in sections, spaced apart from the circuit board by at least one gap at least partially filled with the at least one flowable and curable protective compound, such that the at least one flowable and curable protective compound is in direct contact with the circuit board and with the cooling body, wherein:
    in a cured state of the at least one flowable and curable protective compound, the cooling body cohesively adheres to the at least one flowable and curable protective compound:
    the inner surface of the cooling body includes at least one recess having a base surrounded in encircling fashion by at least one wall;
    the at least one gap is defined by a spacing between the base of the recess and the second side of the circuit board;
    the at least one wall includes a support surface facing toward the second side of the circuit board; and
    the at least one wall is in direct contact, in encircling fashion, with the circuit board.

2. The electronic assembly as claimed in claim 1, further comprising:
    at least one further component arranged on the second side of the circuit board within the at least one recess.

3. The electronic assembly as claimed in claim 1, wherein:
    the at least one wall includes at least one spacing surface facing toward the second side of the circuit board;
    the at least one wall is spaced apart from the circuit board by at least one intermediate space, the at least one intermediate space having a spacing dimension of one millimeter to fifty micrometers; and
    the at least one wall further includes at least one support surface which is in direct contact with the circuit board.

4. The electronic assembly as claimed in claim 3, wherein the at least one intermediate space is at least partially filled with the at least one flowable and curable protective compound.

5. The electronic assembly as claimed in claim 1, wherein:
    the at least one wall is arranged at least partially directly below the at least one heat-generating component or partially directly below at least one heat-conducting layer; and
    the at least one heat-conducting layer is arranged on the second side of the circuit board and at least partially directly below the at least one heat-generating component.

6. The electronic assembly as claimed in claim 1, wherein the at least one gap has a width between the second side of the circuit board and the inner surface of the cooling body that is one millimeter to fifty micrometers over the entire at least one gap.

7. The electronic assembly as claimed in claim 1, wherein:
a first portion of the at least one flowable and curable protective compound is in direct contact with the circuit board and the cooling body; and
the first portion is formed in one piece with a second portion of the at least one flowable and curable protective compound which covers the heat-generating component.

8. The electronic assembly as claimed in claim 1, wherein:
a first portion of the at least one flowable and curable protective compound is in direct contact with the circuit board and the cooling body; and
the first portion is formed in one piece, via at least one aperture formed in the circuit board, with a second portion of the at least one flowable and curable protective compound which covers the heat-generating component.

9. An electronic assembly for a transmission control module, comprising:
a circuit board including:
a first side;
a second side averted from the first side; and
at least one heat-generating component arranged on the first side of the circuit board and covered with at least one flowable and curable protective compound; and
a cooling body including an inner surface facing toward the second side of the circuit board, the inner surface, at least in sections, spaced apart from the circuit board by at least one gap at least partially filled with the at least one flowable and curable protective compound, such that the at least one flowable and curable protective compound is in direct contact with the circuit board and with the cooling body, wherein:
in a cured state of the at least one flowable and curable protective compound, the cooling body cohesively adheres to the at least one flowable and curable protective compound;
the inner surface of the cooling body includes at least one recess having a base surrounded in encircling fashion by at least one wall;
the at least one gap is defined by a spacing between the base of the recess and the second side of the circuit board;
the at least one wall includes at least one spacing surface facing toward the second side of the circuit board;
the at least one wall is spaced apart from the circuit board by at least one intermediate space, the at least one intermediate space having a spacing dimension of one millimeter to fifty micrometers; and
the at least one wall further includes at least one support surface which, in encircling fashion, is in direct contact with the circuit board.

10. An electronic assembly for a transmission control module, comprising:
a circuit board including:
a first side;
a second side averted from the first side;
at least one heat-generating component arranged on the first side of the circuit board and covered with at least one flowable and curable protective compound; and
a cooling body including an inner surface facing toward the second side of the circuit board, the inner surface, at least in sections, spaced apart from the circuit board by at least one gap at least partially filled with the at least one flowable and curable protective compound, such that the at least one flowable and curable protective compound is in direct contact with the circuit board and with the cooling body, wherein:
in a cured state of the at least one flowable and curable protective compound, the cooling body cohesively adheres to the at least one flowable and curable protective compound;
the inner surface of the cooling body includes at least one recess having a base surrounded in encircling fashion by at least one wall; the at least one wall is in direct contact, in encircling fashion, with the circuit board; the at least one gap
is defined by a spacing between the base of the recess and the second side of the circuit board;
the at least one wall is arranged at least partially directly below the at least one heat-generating component or partially directly below at least one heat-conducting layer; and
the at least one heat-conducting layer is arranged on the second side of the circuit board and at least partially directly below the at least one heat-generating component.

* * * * *